(12) United States Patent
Borthakur

(10) Patent No.: US 11,764,314 B2
(45) Date of Patent: Sep. 19, 2023

(54) SCATTERING STRUCTURES FOR SINGLE-PHOTON AVALANCHE DIODES

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 286 days.

(21) Appl. No.: 16/948,100

(22) Filed: Sep. 3, 2020

(65) Prior Publication Data

US 2021/0175376 A1    Jun. 10, 2021

Related U.S. Application Data

(60) Provisional application No. 62/981,902, filed on Feb. 26, 2020, provisional application No. 62/943,475, filed on Dec. 4, 2019.

(51) Int. Cl.
*H01L 31/02* (2006.01)
*H01L 27/146* (2006.01)
(Continued)

(52) U.S. Cl.
CPC .......... *H01L 31/02027* (2013.01); *G02B 3/06* (2013.01); *H01L 27/1463* (2013.01);
(Continued)

(58) Field of Classification Search
CPC ............ H01L 31/107; H01L 31/02027; H01L 31/055; H01L 31/02327; H01L 27/14649;
(Continued)

(56) References Cited

U.S. PATENT DOCUMENTS 7,054,534 B1   5/2006  Gunn, III et al.
7,800,192 B2   9/2010  Venezia et al.
(Continued)

OTHER PUBLICATIONS

Yokogawa et al.: "IR sensitivity enhancement of CMOS Image Sensor with diffractive light trapping pixels." Scientific Reports 7, 3832 (2017).
(Continued)

*Primary Examiner* — Didarul A Mazumder
(74) *Attorney, Agent, or Firm* — Treyz Law Group, P.C.; Joseph F. Guihan

(57) ABSTRACT

An imaging device may include single-photon avalanche diodes (SPADs). To improve the sensitivity and signal-to-noise ratio of the SPADs, light scattering structures may be formed in the semiconductor substrate to increase the path length of incident light through the semiconductor substrate. The light scattering structures may include a low-index material formed in trenches in the semiconductor substrate. The light scattering structures may have different sizes and/or a layout with a non-uniform number of structures per unit area. SPAD devices may also include isolation structures in a ring around the SPADs to prevent crosstalk. The isolation structures may include metal-filled deep trench isolation structures. The metal filler may include tungsten.

18 Claims, 10 Drawing Sheets

(51) Int. Cl.
  *H01L 31/055* (2014.01)
  *H01L 31/107* (2006.01)
  *H01L 31/0232* (2014.01)
  *G02B 3/06* (2006.01)
  *H04N 5/361* (2011.01)
  *H04N 25/63* (2023.01)

(52) U.S. Cl.
  CPC .. *H01L 27/14605* (2013.01); *H01L 27/14621* (2013.01); *H01L 27/14627* (2013.01); *H01L 27/14629* (2013.01); *H01L 27/14643* (2013.01); *H01L 27/14649* (2013.01); *H01L 31/02327* (2013.01); *H01L 31/055* (2013.01); *H01L 31/107* (2013.01); *H01L 27/1464* (2013.01); *H04N 25/63* (2023.01)

(58) Field of Classification Search
  CPC ........... H01L 27/14643; H01L 27/1463; H01L 27/14629; H01L 27/14627; H01L 27/14621; H01L 27/14605; H01L 27/1464; H01L 27/14607; H04N 5/361; G02B 3/06
  USPC .............................. 257/438; 438/48, 91, 380
  See application file for complete search history.

(56) References Cited

U.S. PATENT DOCUMENTS

| | | | |
|---|---|---|---|
| 8,889,455 | B2 | 11/2014 | Duane et al. |
| 9,373,732 | B2 | 6/2016 | Velichko |
| 10,304,987 | B2 | 5/2019 | Droz et al. |
| 11,032,496 | B2 | 6/2021 | Webster |
| 11,289,524 | B2 | 3/2022 | Sulfridge et al. |
| 2007/0075423 | A1 | 4/2007 | Ke et al. |
| 2008/0303932 | A1 | 12/2008 | Wang et al. |
| 2010/0133636 | A1* | 6/2010 | Richardson ........... H01L 31/107 257/438 |
| 2013/0015331 | A1* | 1/2013 | Birk ..................... G01J 1/18 250/208.2 |
| 2013/0082286 | A1* | 4/2013 | Finkelstein ......... H01L 31/0336 257/E31.095 |
| 2013/0193546 | A1* | 8/2013 | Webster ............ H01L 31/02363 257/438 |
| 2014/0015085 | A1 | 1/2014 | Ikeda et al. |
| 2014/0049783 | A1* | 2/2014 | Royo Royo .......... G01S 17/894 250/208.2 |
| 2014/0077323 | A1 | 3/2014 | Velichko et al. |
| 2015/0340391 | A1* | 11/2015 | Webster ............ H01L 27/14627 257/432 |
| 2017/0339355 | A1 | 11/2017 | Lenchenkov et al. |
| 2017/0366769 | A1 | 12/2017 | Mlinar et al. |
| 2018/0026147 | A1 | 1/2018 | Zhang et al. |
| 2018/0182806 | A1 | 6/2018 | Jin et al. |
| 2018/0211990 | A1* | 7/2018 | Yorikado .......... H01L 27/14627 |
| 2018/0308881 | A1 | 10/2018 | Hynecek |
| 2019/0097075 | A1* | 3/2019 | Rae .................. H01L 31/02027 |
| 2019/0131339 | A1* | 5/2019 | Chiang ............ H01L 27/14621 |
| 2019/0131478 | A1* | 5/2019 | Wang ................ H01L 27/14689 |
| 2019/0165026 | A1* | 5/2019 | Kuo .................. H01L 27/14607 |
| 2019/0326482 | A1 | 10/2019 | Brick et al. |
| 2020/0020730 | A1 | 1/2020 | Mlinar et al. |
| 2020/0058808 | A1 | 2/2020 | Morimoto et al. |
| 2020/0284883 | A1 | 9/2020 | Ferreira et al. |
| 2021/0082978 | A1* | 3/2021 | Hsieh ................ H01L 27/14649 |
| 2021/0408090 | A1 | 12/2021 | Kohyama |
| 2022/0199668 | A1 | 6/2022 | Ootani et al. |

OTHER PUBLICATIONS

Park et al.: "Pixel Technology for Improving IR Quantum Efficiency of Backside-illuminated CMOS Image Sensor." International Image Sensor Society, 2019 Workshop. Jun. 23-27, 2019.

Green et al.: "Characterization of 23-Percent Efficient Silicon Solar Cells." IEEE Transactions on Electron Devices. vol. 37, No. 2. Feb. 1990.

* cited by examiner

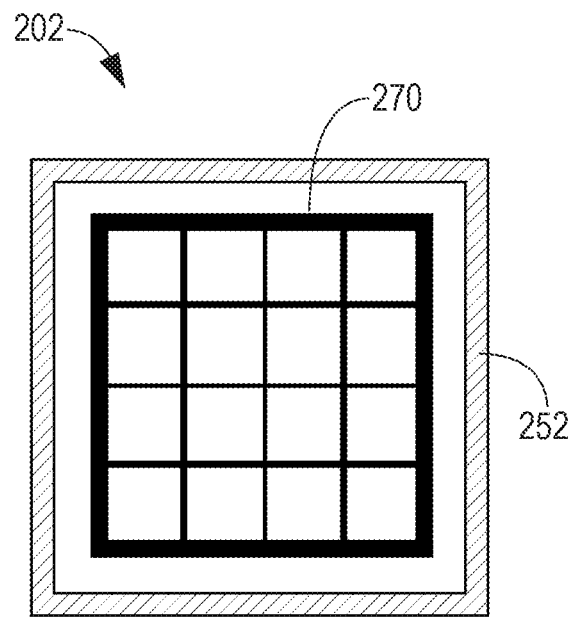
FIG. 7E
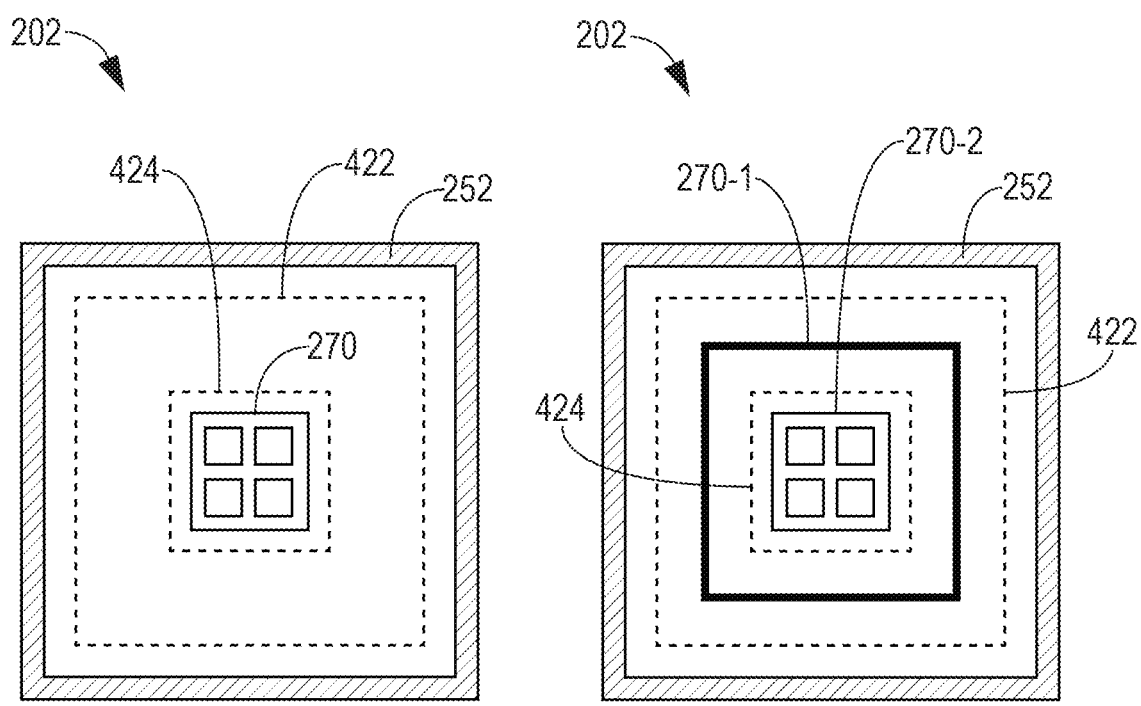
FIG. 7F
FIG. 7G

SCATTERING STRUCTURES FOR SINGLE-PHOTON AVALANCHE DIODES

This application claims the benefit of provisional patent application No. 62/943,475, filed Dec. 4, 2019, and provisional patent application No. 62/981,902, filed Feb. 26, 2020, which are hereby incorporated by reference herein in their entireties.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection. However, single-photon avalanche diodes may have lower than desired dynamic range and may be susceptible to crosstalk.

It is within this context that the embodiments described herein arise.

BRIEF DESCRIPTION OF THE DRAWINGS

FIGS. 7A-7G are top views of various arrangements for an illustrative SPAD-based semiconductor device having isolation structures in accordance with an embodiment.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
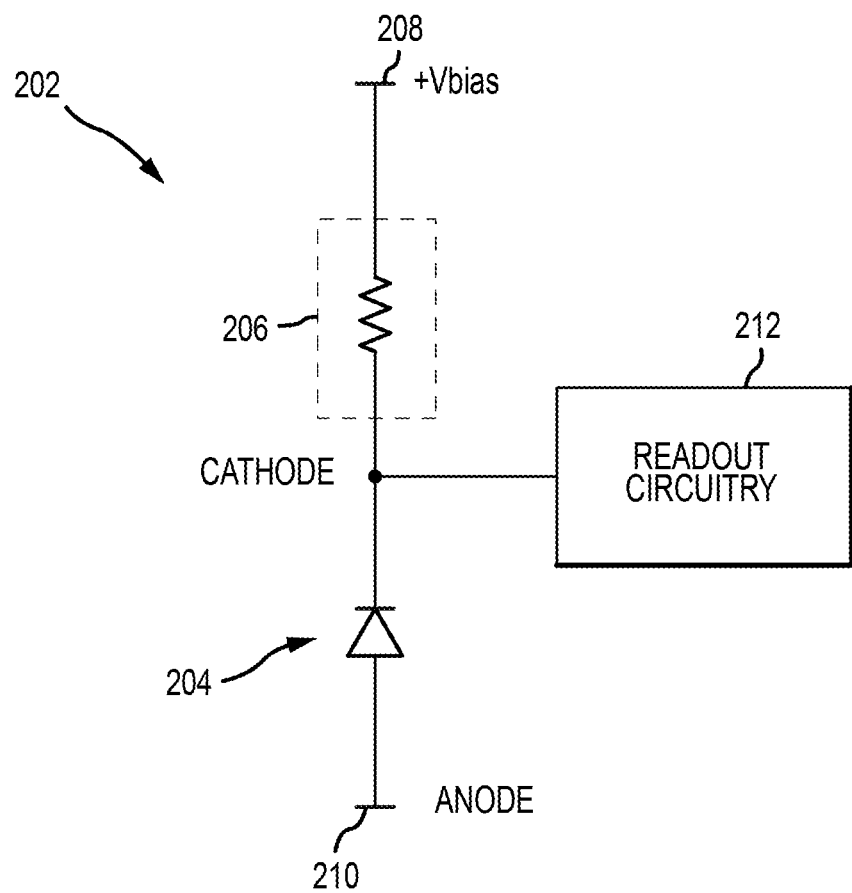
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
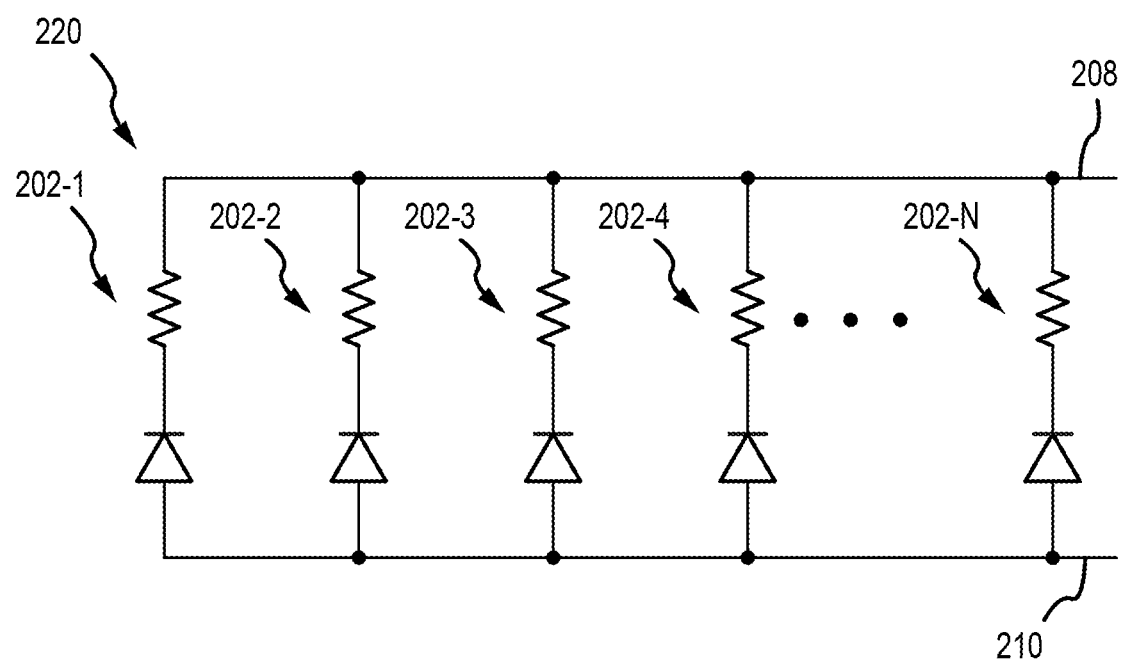
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
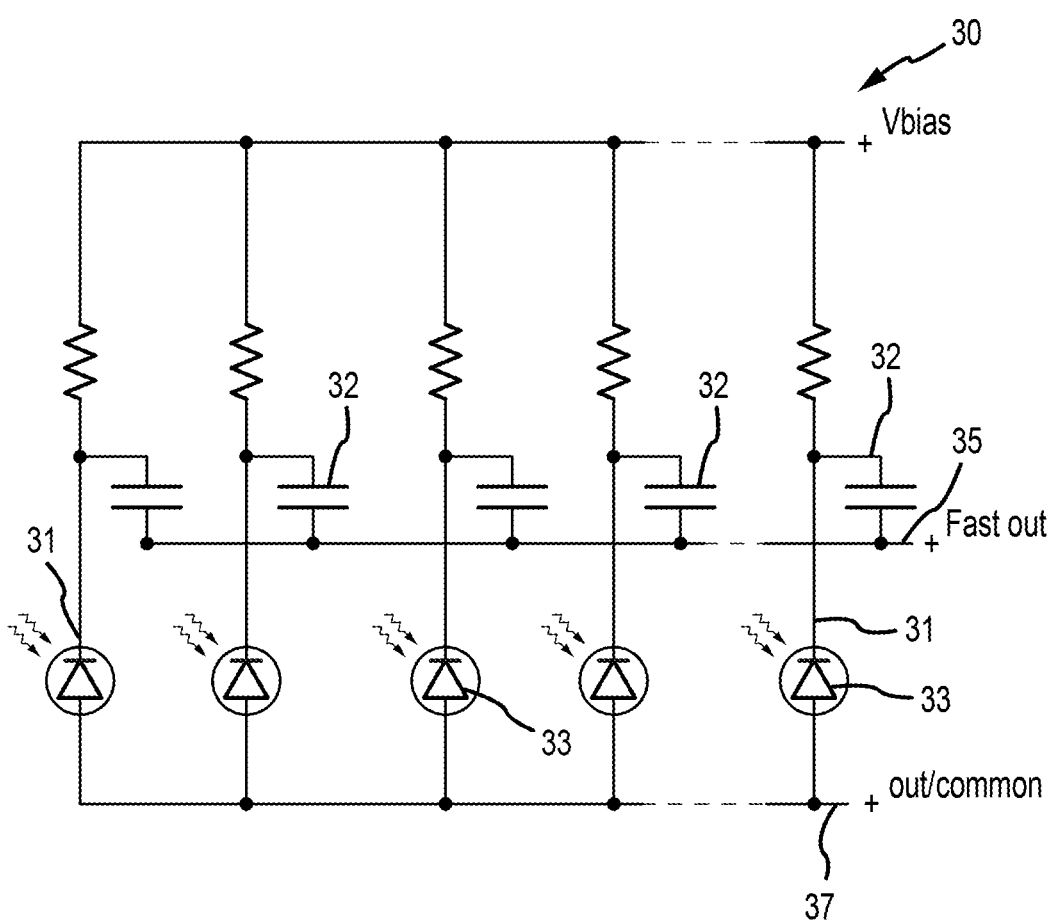
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
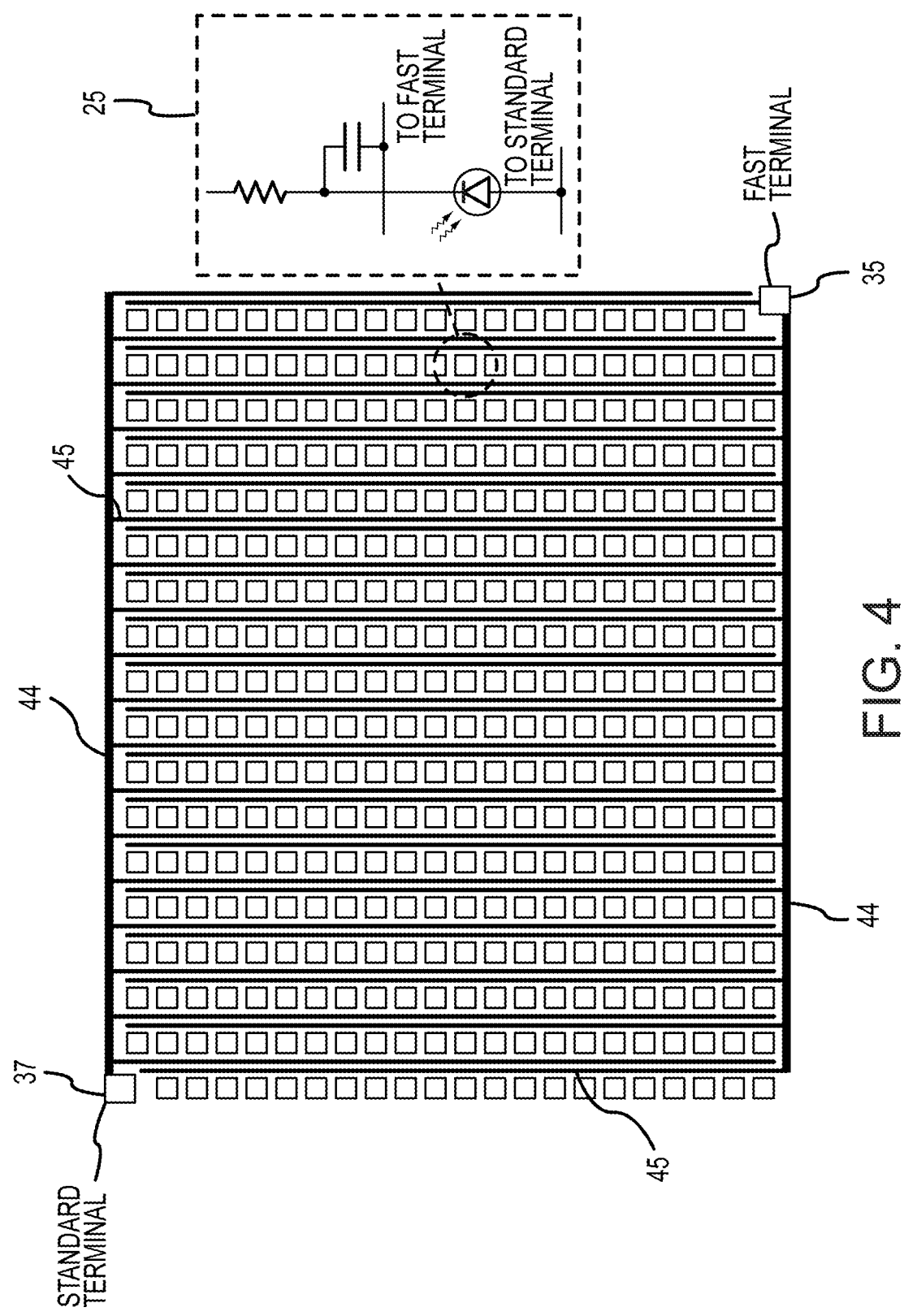
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus lines 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
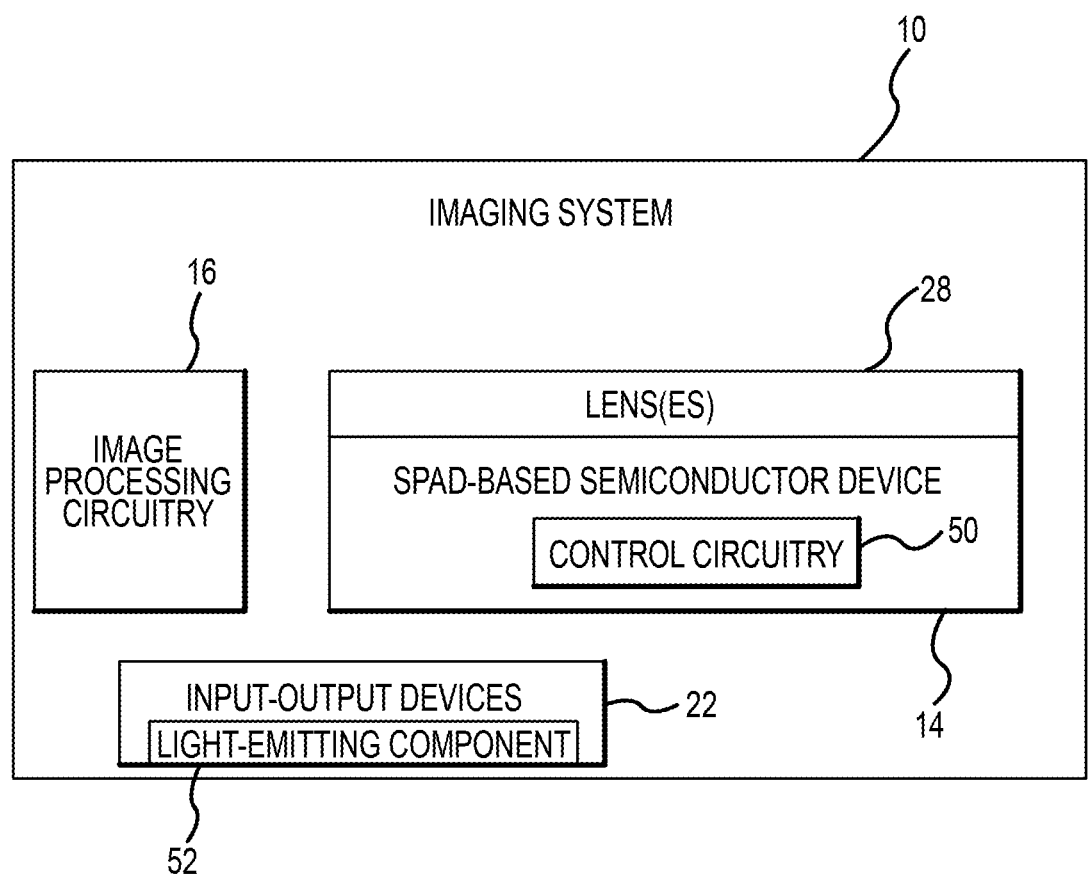
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications. Imaging system 10 may sometimes be referred to as a SPAD-based imaging system.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

SPAD-based semiconductor device 14 may include circuitry such as control circuitry 50. The control circuitry for the SPAD-based semiconductor device may be formed either on-chip (e.g., on the same semiconductor substrate as the SPAD devices) or off-chip (e.g., on a different semiconductor substrate as the SPAD devices). The control circuitry may control operation of the SPAD-based semiconductor device. For example, the control circuitry may operate active quenching circuitry within the SPAD-based semiconductor device, may control a bias voltage provided to bias voltage supply terminal 208 of each SPAD, may control/monitor the readout circuitry coupled to the SPAD devices, etc.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Any of the aforementioned circuits may be considered part of the control circuitry 50 of FIG. 5.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene. In some cases, some or all of control circuitry 50 may be formed integrally with image processing circuitry 16.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component 52 may be included in the imaging system to emit light (e.g., infrared light or light of any other desired type). Light-emitting component 52 may be a laser, light-emitting diode, or any other desired type of light-emitting component. Semiconductor device 14 may measure the reflection of the light off of an object to measure distance to the object in a LIDAR (light detection and ranging) scheme. Control circuitry 50 that is used to control operation of the SPAD-based semiconductor device may also optionally be used to control operation of light-emitting component 52. Image processing circuitry 16 may use known times (or a known pattern) of light pulses from the light-emitting component while processing data from the SPAD-based semiconductor device.

Figure 6:
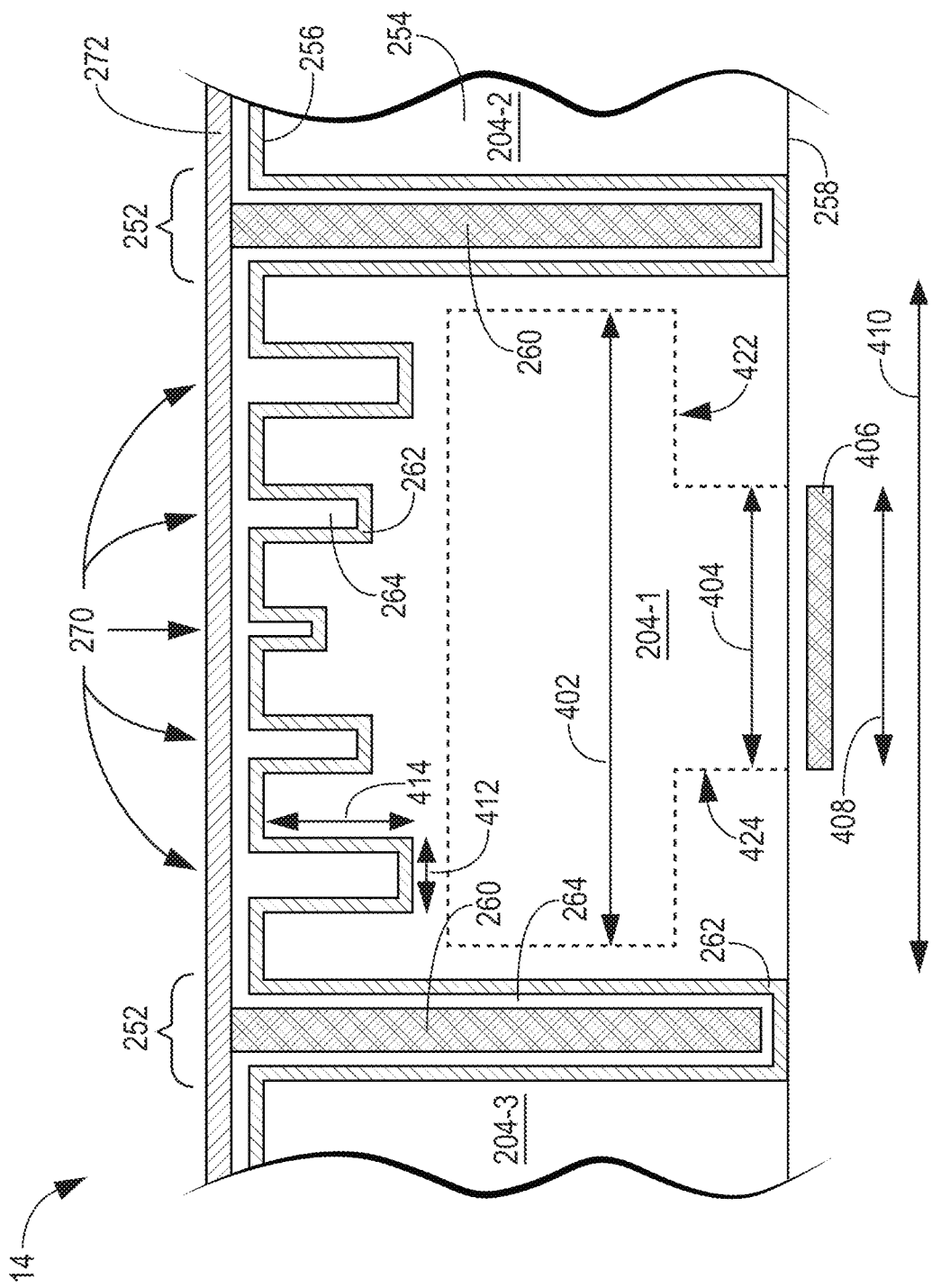
FIG. 6 is a cross-sectional side view of an illustrative SPAD-based semiconductor device having isolation structures and light scattering structures in accordance with an embodiment.

FIG. 6 is a cross-sectional side view of an illustrative SPAD-based semiconductor device having isolation structures and scattering structures. SPAD-based semiconductor device 14 includes a SPAD 204-1 that is adjacent to respective SPADs (e.g., SPAD 204-2 and SPAD 204-3 in FIG. 6). Each SPAD may be considered part of a respective SPAD device, SPAD pixel, or microcell (e.g., microcell 202 in FIG. 1). The SPAD-based semiconductor device 14 in FIG. 6 is a backside illuminated (BSI) device (e.g., incident light passes through the back surface). SPAD 204-1 may be isolated from the adjacent SPADs by isolation structures 252. The isolation structures may include deep trench isolation (DTI) that includes metal-filled trenches.

In particular, trenches may be formed in a substrate 254 (e.g., a semiconductor substrate formed from a material such as silicon) that extends from the back surface 256 to the front surface 258. The trench for isolation structures 252 therefore extends completely through the semiconductor substrate 254. The trench may be etched from the backside of the substrate (e.g., from surface 256 towards surface 258) and therefore may be referred to as backside deep trench isolation (BDTI). Forming the trench as backside deep trench isolation (as in FIG. 6) may mitigate the complexity and cost of manufacturing. However, the trench may alternatively be formed as front side deep trench isolation (extending from surface 258 to surface 256) if desired.

The trench of isolation structures 252 may be filled with a metal filler 260 (e.g., tungsten or any other desired metal). The metal filler isolates SPAD 204-1 from adjacent SPADs.

A high dielectric constant coating 262 may be formed in the trench between the substrate 254 and metal filler 260. The high dielectric constant coating 262 (sometimes referred to as high k coating 262 or passivation layer 262) may mitigate dark current. As one example, the passivation coating may be an oxide coating (e.g., aluminum oxide, hafnium oxide, tantalum oxide, etc.). A buffer layer 264 may be formed between passivation coating 262 and metal filler 260. The buffer layer 264 may be formed from silicon dioxide or another desired material (e.g., a material compatible with both the passivation coating and the metal filler).

In addition to the isolation structures, scattering structures 270 may be formed in the substrate. Scattering structures 270 may be configured to scatter incident light (e.g., using a low-index material that fills trenches in substrate 254), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths (e.g., near infrared light).

The scattering structures may be formed by backside trenches (e.g., trenches that extend from surface 256 towards surface 258). The backside trenches may be filled by the same passivation coating 262 and buffer layer 264 as isolation structures 252. As shown, passivation coating 262 has portions in the trenches of isolation structures 252 and portions in the trenches of scattering structures 270. This enables the passivation layer in both isolation structures 252 and scattering structures 270 to be formed in the same deposition step during manufacturing if desired. The thickness of passivation coating 262 may be uniform in isolation structures 252 and scattering structures 270 or may be different in isolation structures 252 and scattering structures 270.

The material(s) that fill the trenches (e.g., buffer 264 and passivation layer 262) of light scattering structures 270 may have a lower refractive index than substrate 254 (e.g., a refractive index that is lower by more than 0.1, more than 0.2, more than 0.3, more than 0.5, more than 1.0, etc.). The low-index material in the trenches causes refractive scattering of incident light.

As shown in FIG. 6, buffer layer 264 has portions in the trenches of isolation structures 252 and portions in the trenches of scattering structures 270. This enables the buffer layer 264 in both isolation structures 252 and scattering structures 270 to be formed in the same deposition step during manufacturing if desired. The thickness of buffer layer 264 may be uniform in isolation structures 252 and scattering structures 270 or may be different in isolation structures 252 and scattering structures 270. As shown in FIG. 6, the buffer layer 264 may fill trenches for scattering structures 270 and extend above the plane of surface 256. The upper surface of buffer layer 264 may be coplanar with the upper surface of metal filler 260.

Scattering structures 270 scatter incident light, thereby increasing the path length of the light through the semiconductor substrate and increasing the probability of the incident light being absorbed by the semiconductor. Isolation structures 252 prevent the scattered light from reaching an adjacent SPAD and causing cross-talk.

The arrangement of scattering structures 270 may be selected to optimize the conversion of incident light. As shown in FIG. 6, the area of SPAD 204-1 may not include the entirety of the substrate 254. As shown, the SPAD may include a first portion 422 having a first width 402 and a second portion 424 having a second width 404 that is different than the first portion. In FIG. 6, width 404 is smaller than width 402. Consequently, dead zones of semiconductor 254 (that are not part of SPAD 204-1) may be formed on either side of SPAD 204-1 around the SPAD portion 424. The arrangement of scattering structures 270 may be selected to direct incident light to SPAD 204-1 and not the dead zones.

A front side reflector 406 may optionally be formed at the front side of the SPAD 204-1. As shown, front side reflector 406 is adjacent to the front surface 258 of semiconductor substrate 254. Front side reflector 406 may have a width 408 that is approximately equal to the width 404 of portion 424 of SPAD 204-1. In this way, reflector 406 may be less likely to redirect light to the dead zones. The total width 410 of the SPAD device (microcell) may extend between isolation structures 252. Width 408 of the reflector is smaller than width 410. Width 408 may be less than 90% of width 410, less than 80% of width 410, less than 60% of width 410, less than 50% of width 410, less than 40% of width 410, between 20% and 90% of width 410, etc.

Each light scattering structure 270 has a respective width 412 and depth 414. The scattering structures may have different widths and different depths, as shown in FIG. 6. The scattering structures may be formed during a single etching step with a single etching time, such that structures with a greater width also have a greater depth. In the example of FIG. 6, the scattering structures 270 have vertical sidewalls (e.g., sidewalls orthogonal to surface 256). This example is merely illustrative and the scattering structures may have angled sidewalls if desired. For example, the scattering structures may be pyramidal scattering structures in another possible embodiment.

An additional insulating layer 272 may be formed over the backside of the substrate. The insulating layer 272 may ensure that metal filler 260 is isolated from additional metal structures on the backside surface of the substrate (e.g., bond pads, ground structures, etc.).

If desired, the metal filler 260 of isolation structures 252 may be coupled to a bias voltage supply terminal. For example, the metal filler may be held at ground or another desired voltage. The voltage applied to metal filler 260 may be constant or may vary over time.

FIGS. 7A-7E are top views of illustrative SPAD devices showing the isolation structures and various arrangements for the scattering structures. In each of FIGS. 7A-7E, the isolation structures 252 extend around the perimeter of microcell 202. In other words, the isolation structures are ring-shaped. The SPAD (e.g., SPAD 204-1) of microcell 202 may be completely laterally surrounded by the isolation structures 252.

Figure 7A:
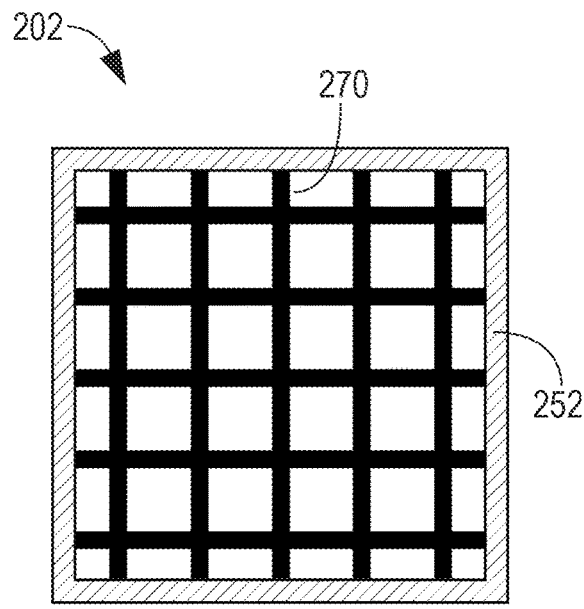
Figure 7B:
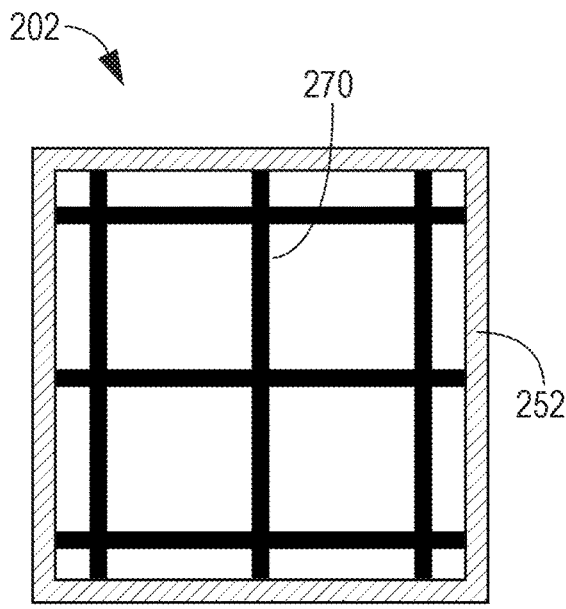

Various arrangements for scattering structures 270 are possible. An example is shown in FIG. 7A where the scattering structures are arranged in a uniform grid. Five trenches extend in columns across the diode and five trenches extend in rows across the diode. FIG. 7B is an example of a uniform grid with a lower density than in FIG. 7A. In FIG. 7B, three trenches extend in columns across the diode and three trenches extend in rows across the diode. In general, the density of the scattering structures (e.g., the number of scattering structures per unit area) across the microcell may be constant or may vary.

Figure 7C:
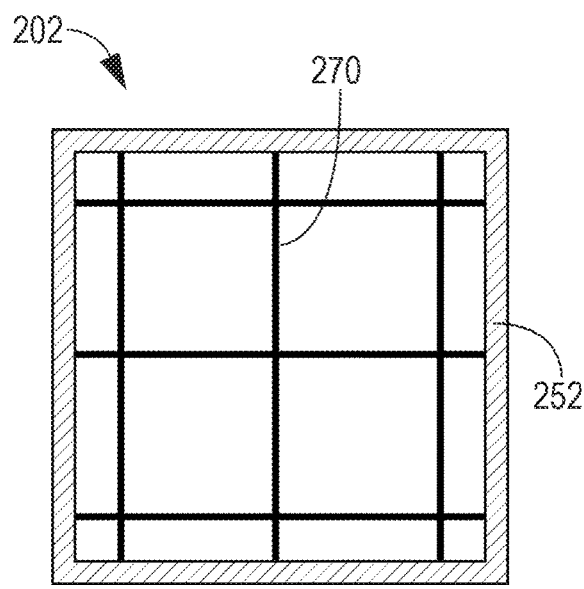
Figure 7D:
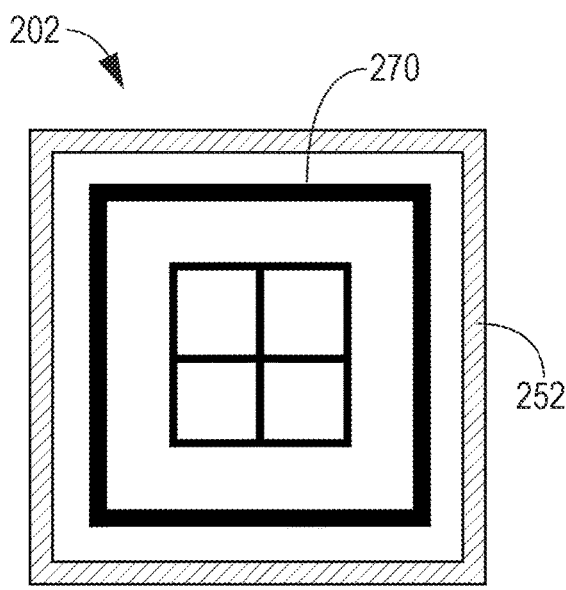

The width of the trenches may vary. FIG. 7C shows an example of scattering structures 270 having trenches with a smaller width than in FIG. 7B. As shown in FIG. 7D, the scattering structures may also have a non-uniform layout across the diode. In FIG. 7D, there are scattering structures of two different widths within the diode. In FIG. 7E, there are scattering structures of three different widths within the diode.

The arrangement of the scattering structures may optimize the pattern of light received by the underlying SPAD. FIG. 7F shows a top view of portions 422 and 424 of SPAD 204-1. As shown, scattering structures 270 may be formed only over the center of the SPAD such that the scattering structures do not extend past the footprint of portion 424 of the diode. In other words, all of the scattering structures 270 directly overlap portion 424 of the diode. There are no portions of scattering structures 270 that do not directly overlap portion 424 of the diode.

FIG. 7F shows an example of selective positioning of scattering structures 270 over the SPAD 204-1. Light-scattering structures 270 are non-uniformly distributed across the SPAD 204-1 (e.g., the number of light-scattering structures per unit area is inconsistent across the SPAD).

In FIG. 7F, the density of light scattering structures is higher in the middle of the SPAD than in the periphery of the SPAD. The width of the light scattering structures is also higher in the middle of the SPAD than in the periphery of the SPAD. This example is merely illustrative. In an alternate embodiment, the light scattering structures 270 may have a higher density in the periphery than in the center of the SPAD. The light scattering structures may only overlap diode portion 422 without overlapping diode portion 424, for example.

In the non-uniform layouts of FIGS. 7D and 7E, the scattering structures at the center of the microcell 202 are narrower (and therefore shallower) than the scattering structures at the periphery of the SPAD. This example is merely illustrative. In FIG. 7G, scattering structure 270-2 at the center of microcell 202 (e.g., overlapping portion 424) may be wider (and therefore deeper) than an additional scattering structure 270-1 (that overlaps portion 422 but not portion 424).

Every SPAD device in the SPAD-based semiconductor device may have the same arrangement of light scattering structures or different SPAD devices may have different arrangements of light scattering structures.

In general, each scattering structure may have a depth of less than 5 micron, less than 3 micron, less than 2 micron, less than 1 micron, less than 0.5 micron, greater than 0.1 micron, greater than 0.5 micron, greater than 1 micron, between 1 and 2 micron, between 0.5 and 3 micron, etc. Each scattering structure may have a width of less than 3 micron, less than 2 micron, less than 1 micron, less than 0.5 micron, less than 0.2 micron, less than 0.1 micron, greater than 0.1 micron, greater than 0.5 micron, greater than 1 micron, between 0.1 and 2 micron, etc. The semiconductor substrate may have a thickness of greater than 4 micron, greater than 6 micron, greater than 8 micron, greater than 10 micron, greater than 12 micron, less than 12 micron, between 4 and 10 micron, between 5 and 20 micron, less than 10 micron, less than 6 micron, less than 4 micron, less than 2 micron, greater than 1 micron, etc.

Figure 8:
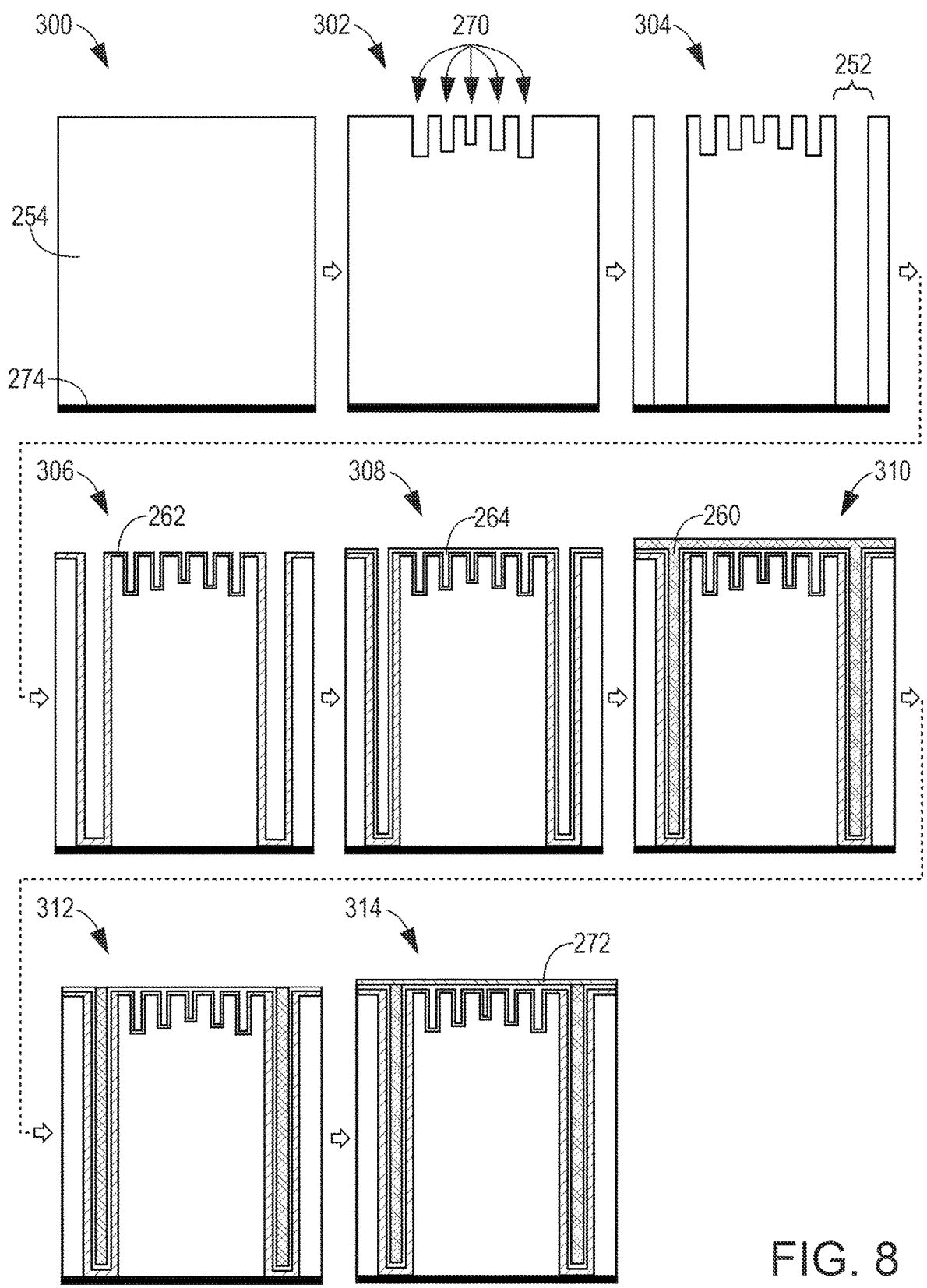
FIG. 8 is a diagram showing an illustrative method of forming a SPAD-based semiconductor device having isolation structures and light scattering structures in accordance with an embodiment.

FIG. 8 is a diagram showing method steps for forming a SPAD with isolation and scattering structures of the type shown in FIG. 6. At step 300, the process begins with semiconductor substrate 254 (which may be epitaxial silicon in one example). The semiconductor substrate 254 may be formed on a silicon dioxide layer 274 if desired.

At step 302, trenches may be formed in the backside of substrate 254 for scattering structures 270. The trenches may be formed to have different widths and depths in the same etching step. In general, in a single etching step, a trench with a greater width will also have a greater depth. This can be leveraged to form trenches of different depths and widths in a single etch.

At step 304, a backside trench may be formed completely through the substrate for isolation structures 252. At step 306, passivation coating 262 may be formed in the trenches for both isolation structures 252 and scattering structures 270. At step 308, a buffer layer 264 (e.g., silicon dioxide) may be formed in the trenches for both isolation structures 252 and scattering structures 270. The buffer layer 264 may completely fill the trenches for scattering structures 270. The buffer layer 264 does not completely fill the trenches for isolation structures 252. At step 310, metal material (e.g., tungsten) is formed over the substrate. The metal material 260 may fill the trenches of isolation structures 252 and may cover the remaining portions of the substrate.

At step 312, the excess metal filler (e.g., the metal not contained in isolation structures 252) may be removed in a chemical mechanical planarization (CMP) step. At step 314, an additional coating 272 may be formed over the substrate to cover the exposed portions of metal filler 260. In subsequent processing steps, grounding structures, shielding structures, and or bond pad structures may additionally be formed for the SPAD-based semiconductor device.

Figure 9:
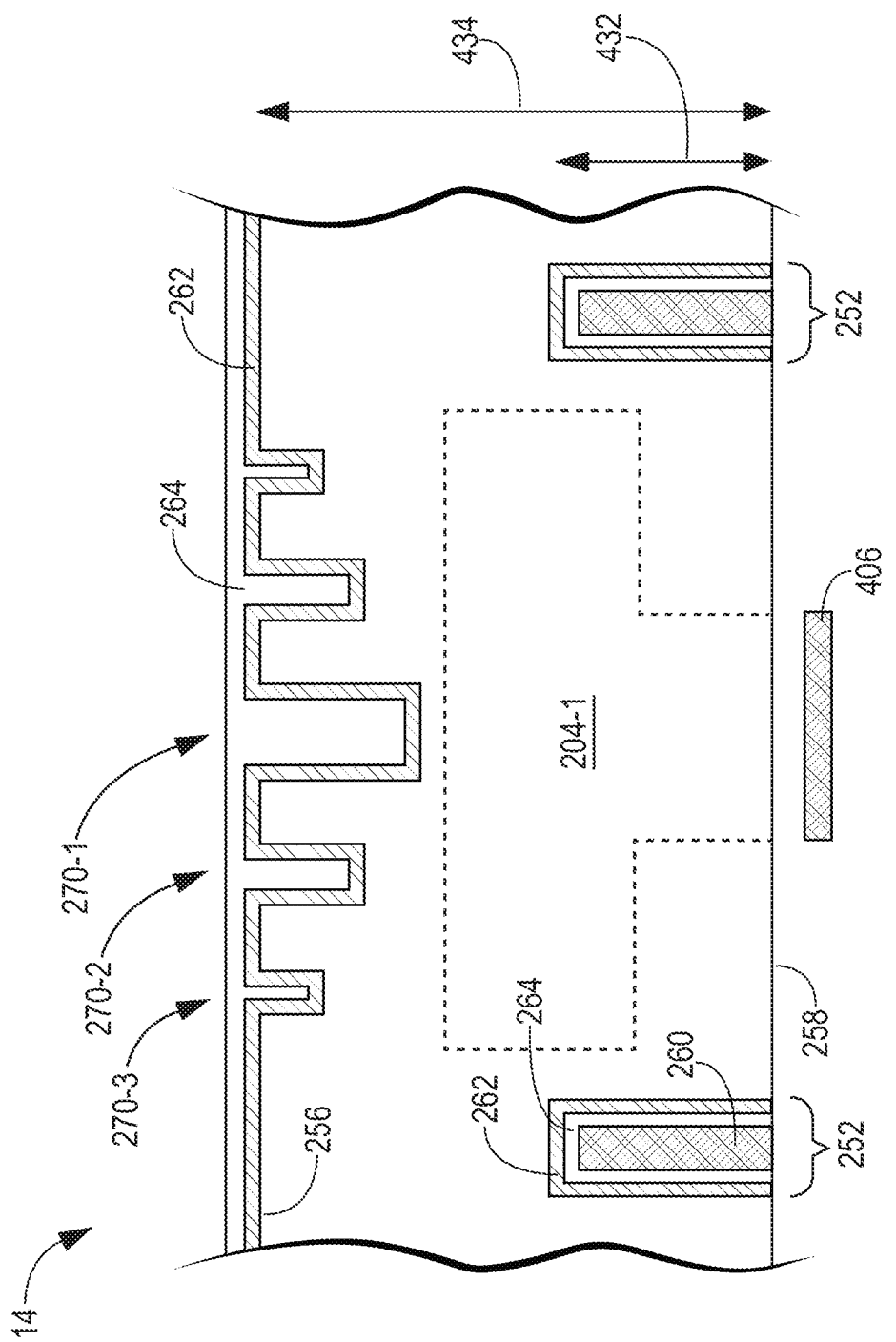
FIG. 9 is a cross-sectional side view of an illustrative SPAD-based semiconductor device having front side deep trench isolation structures and light scattering structures in accordance with an embodiment.

The example of isolation structures 252 being formed from backside deep trench isolation is merely illustrative. FIG. 9 is a cross-sectional side view of an illustrative SPAD-based semiconductor device showing how the isolation structures may be front side deep trench isolation structures. As shown, a trench may extend from front surface 258 towards back surface 256. The trench may be filled with a passivation layer 262, buffer layer 264 and metal filler 260 similar to as in FIG. 6. The same materials as discussed in connection with FIG. 6 may be used in FIG. 9 and therefore are not repeated.

FIG. 9 also shows how isolation structures 252 may have a depth 432 that is less than the overall thickness of semiconductor substrate 434. Depth 432 may be less than 90% of thickness 434, less than 80% of thickness 434, less than 60% of thickness 434, less than 50% of thickness 434, less than 40% of thickness 434, between 20% and 90% of thickness 434, etc. The FDTI may alternatively extend entirely through the substrate (similar to the BDTI of FIG. 6).

In FIG. 9, the central scattering structure 270-1 (at the center of SPAD 204-1) has a greater depth and width than scattering structure 270-2. Scattering structure 270-3 (which is further from the center of the device than scattering structure 270-2) has a smaller depth and width than scattering structure 270-2. This shows an example of the type shown in FIG. 7G (with light scattering structures having decreasing width with increasing distance from the center of the SPAD device). This is merely illustrative and any other possible light scattering structure arrangement may be used in FIG. 9.

The foregoing is merely illustrative of the principles of this invention and various modifications can be made by those skilled in the art. The foregoing embodiments may be implemented individually or in any combination.

What is claimed is:

1. A semiconductor device comprising:
  a substrate;
  a single-photon avalanche diode formed in the substrate;
  an isolation structure formed around a periphery of the single-photon avalanche diode, wherein the isolation structure comprises a metal filler in a trench;
  a plurality of light scattering structures formed in the substrate over the single-photon avalanche diode, wherein the plurality of light scattering structures comprises a first light scattering structure that reaches a first depth in the substrate and a second light scattering structure that reaches a second depth in the substrate and wherein the first depth is greater than the second depth;
  a passivation layer in the trench that is interposed between the metal filler and the substrate; and
  a buffer layer in the trench that is interposed between the metal filler and the passivation layer.

2. The semiconductor device defined in claim 1, wherein the isolation structure comprises a front side deep trench isolation structure.

3. The semiconductor device defined in claim 2, wherein the substrate has a thickness, wherein the trench has a depth, and wherein the depth of the trench is less than the thickness of the substrate.

4. The semiconductor device defined in claim 2, wherein the substrate has first and second opposing surfaces and wherein the front side deep trench isolation structure extends entirely through the substrate from the first surface to the second surface.

5. The semiconductor device defined in claim 1, wherein the isolation structure comprises a backside deep trench isolation structure.

6. The semiconductor device defined in claim 5, wherein the substrate has first and second opposing surfaces and wherein the backside deep trench isolation structure extends entirely through the substrate from the first surface to the second surface.

7. The semiconductor device defined in claim 1, wherein the metal filler comprises tungsten.

8. The semiconductor device defined in claim 5, wherein each one of the plurality of light scattering structures comprises a portion of the passivation layer formed in a respective trench.

9. The semiconductor device defined in claim 8, wherein each one of the plurality of light scattering structures comprises a portion of the buffer layer in its respective trench.

10. The semiconductor device defined in claim 1, wherein the substrate comprises first and second opposing sides, wherein the plurality of light scattering structures is formed in the first side of the substrate, and wherein the semiconductor device further comprises a reflector adjacent to the second side of the substrate.

11. The semiconductor device defined in claim 10, wherein the single-photon avalanche diode has a first width and the reflector has a second width that is smaller than the first width.

12. The semiconductor device defined in claim 1, wherein each one of the plurality of light scattering structures comprises a trench and material formed in the trench that has a lower refractive index than the substrate.

13. The semiconductor device defined in claim 1, wherein the plurality of light scattering structures has a non-uniform density over the single-photon avalanche diode.

14. The semiconductor device defined in claim 1, wherein the first light scattering structure has a first width, wherein the second light scattering structure has a second width, and wherein the first width is greater than the second width.

15. The semiconductor device defined in claim 14, wherein the plurality of light scattering structures comprises a third light scattering structure that reaches a third depth in the substrate and that has a third width, wherein the third width is between the first and second widths, and wherein the third depth is between the first and second depths.

16. A semiconductor device comprising:
  a substrate;
  a single-photon avalanche diode formed in the substrate;
  a deep trench isolation structure that extends in a ring around the single-photon avalanche diode; and
  a plurality of light scattering structures formed in the substrate over the single-photon avalanche diode, wherein the plurality of light scattering structures comprises a first light scattering structure having a first width and a second light scattering structure having a second width that is different than the first width;
  wherein the single-photon avalanche diode has a first portion having a third width and a second portion having a fourth width, wherein the fourth width is less than the third width, wherein the first and second portions overlap; and
  wherein the first light scattering structure overlaps only the first portion, and wherein the second light scattering structure overlaps both the first and second portions.

17. A semiconductor device comprising:
  a substrate;
  a single-photon avalanche diode formed in the substrate;
  a front side deep trench isolation structure that extends in a ring around the single-photon avalanche diode; and
  a plurality of light scattering structures formed in the substrate over the single-photon avalanche diode, wherein the plurality of light scattering structures has a non-uniform number of light scattering structures per unit area over the single-photon avalanche diode.

18. The semiconductor device defined in claim 17, wherein the substrate has a thickness, wherein the front side deep trench isolation structure includes material in a trench, wherein the trench has a depth, and wherein the depth of the trench is less than the thickness of the substrate.

* * * * *